(12) United States Patent
Hokenmaier

(10) Patent No.: US 7,525,860 B2
(45) Date of Patent: Apr. 28, 2009

(54) SYSTEM AND METHOD FOR MONITORING TEMPERATURE IN A MULTIPLE DIE PACKAGE

(75) Inventor: Wolfgang Hokenmaier, Burlington, VT (US)

(73) Assignee: Qimonda North American Corp., Cary, NC (US)

( * ) Notice: Subject to any disclaimer, the term of this patent is extended or adjusted under 35 U.S.C. 154(b) by 170 days.

(21) Appl. No.: 11/790,927

(22) Filed: Apr. 30, 2007

(65) Prior Publication Data

US 2008/0267258 A1    Oct. 30, 2008

(51) Int. Cl.
*G11C 7/00* (2006.01)
(52) U.S. Cl. ........... 365/211; 365/185.24; 365/189.011; 365/189.2; 365/207
(58) Field of Classification Search ................. 365/211, 365/185.24, 189.011, 189.2, 207
See application file for complete search history.

(56) References Cited

U.S. PATENT DOCUMENTS

2003/0227809 A1* 12/2003 Schwartz .................... 365/211
2004/0071029 A1* 4/2004 Sutardja ..................... 365/211

\* cited by examiner

*Primary Examiner*—Pho M. Luu
(74) *Attorney, Agent, or Firm*—Posz Law Group, PLC

(57) ABSTRACT

A temperature control circuit, comprising: a plurality of temperature sensors each configured to measure a temperature of a corresponding memory chip chosen from a plurality of memory chips, and to generate a sensor output signal that is set to a first voltage if the measured temperature of the corresponding memory chip meets a temperature requirement, and is set to a floating voltage if the measured temperature of the corresponding memory chip does not meet the temperature requirement, the sensor output signal being connected to an intermediate node; a current source connected to the intermediate node; and a control circuit configured to provide chip control signals to the plurality of memory chips.

26 Claims, 3 Drawing Sheets

# SYSTEM AND METHOD FOR MONITORING TEMPERATURE IN A MULTIPLE DIE PACKAGE

FIELD OF THE INVENTION

The present invention relates in general to a system and method for monitoring and controlling the temperature of multiple-chip package (MCP) at one time. In particular it relates to a system and method for connecting multiple temperature-sensing signals in an MCP to a single output line such that when any of the multiple temperature sensing signals indicate overheating, the combined sensor output signal will indicate an overheating condition.

BACKGROUND OF THE INVENTION

A semiconductor device (i.e., chip) is designed to function properly below a set temperature threshold. When the device operates below this threshold temperature, it performs within desired parameters. But if its temperature rises above this threshold, the performance of the device may degrade and it may begin to experience logic errors. Furthermore, if the temperature of the chip rises high enough, it may suffer permanent damage, rendering the chip useless for its designed function.

One source of heat is environmental, i.e., the temperature of the area in which the device is operated; another source of heat is from the device itself. During normal operation, the semiconductor device will generate a certain amount of waste heat. This amount of internally-generated waste heat only increases as the clock frequency and circuit density on a chip increase, and its die size decreases.

In order to minimize the chance of chips overheating, many products incorporating semiconductor chips include elements to minimize the temperature of the chips. These can include heat sinks, fans, or the like. In addition, products incorporating semiconductor chips are often placed in temperature-controlled rooms to better maintain an acceptable temperature.

Despite precautions, however, it may be difficult to guarantee that any given chip will be maintained below its threshold temperature. Therefore, many chips will include a temperature sensor that indicates when the temperature of the chip rises to a dangerous level. By monitoring the output of such a temperature sensor, a product incorporating the semiconductor chip can determine when the temperature of the chip is rising too high and take necessary precautions (e.g., slowing down the clock speed of the chip, shutting the chip down for a time, etc.).

But a rising trend in electronic products can serve to complicate this temperature monitoring operation. Many electronic products include multiple chips within a single package. These multiple-chip products or multiple-chip packages (MCPs) each contain more than one semiconductor chip, and each chip may have its own temperature sensor. This may result in an MCP controller that receives multiple temperature-sensing signals, and will require that the MCP controller be provided with a mechanism for processing these multiple temperature-sensing signals in an effective and efficient manner.

SUMMARY OF THE INVENTION

A temperature control circuit is provided, comprising: a plurality of temperature sensors each configured to measure a temperature of a corresponding memory chip chosen from a plurality of memory chips, and to generate a sensor output signal that is set to a first voltage if the measured temperature of the corresponding memory chip meets a temperature requirement, and is set to a floating voltage if the measured temperature of the corresponding memory chip does not meet the temperature requirement, the sensor output signal being connected to an intermediate node; a current source connected to the intermediate node; and a control circuit configured to provide chip control signals to the plurality of memory chips.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

Figure 1:
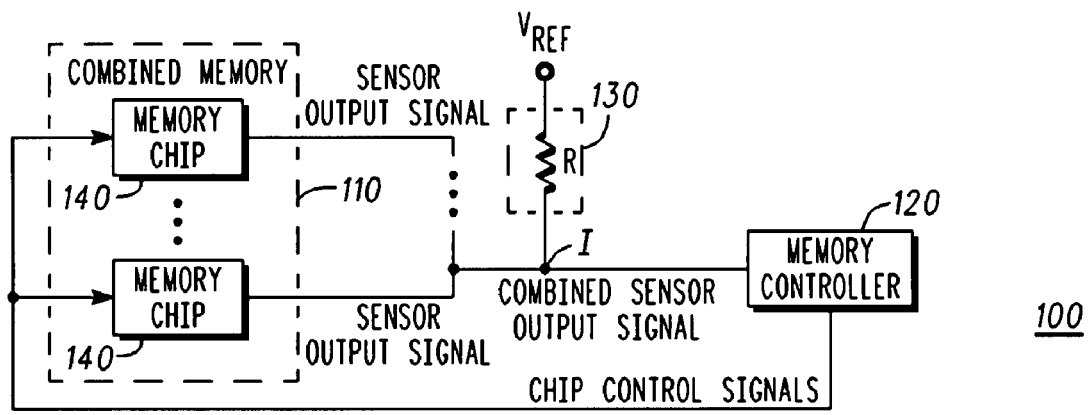
FIG. 1 is a diagram of a multiple-chip memory device according to a disclosed embodiment.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

In addition, reference is made throughout to "high" and "low" bit values or bit values of "1" and "0." For purposes of explanation a high reference voltage is used to represent a high or "1" bit value and a low reference voltage or ground voltage is used to represent a low or "0" bit value, and many circuit elements are triggered by one or the other bit value. It should be understood that particular voltages could be changed and that the operation of disclosed elements based on particular bit values could be switched around between high and low.

Much of the inventive functionality and many of the inventive principles when implemented, may be supported with or in integrated circuits (ICs), such as dynamic random access memory (DRAM) devices, static random access memory (SRAM) devices, or the like. In particular, they may be implemented using CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments.

When controlling a memory device, a memory controller is typically designed to treat the memory device as a single unit, not as a set of individual sub-units. Thus, it will accept a single indicator as to whether the chip is overheating. However, some memory devices today are made up of more than one chip. These multiple-chip products or multiple chip packages (MCPs) may have a temperature-sensing signal generated at each of the individual chips. But typical memory controllers are provided only with one signal indicating an overheating determination. This is particularly true for controllers designed to control single-chip memory devices, which would only have a single temperature-sensing signal.

One way to deal with multiple temperature-sensing signals is to ignore all but one. The manufacturer of the MCP memory device could simply make a determination during design as to which chip is most likely to be the hottest at any given time and use the temperature-sensing signal from that chip as a temperature-sensing signal for the entire MCP. However, this runs the risk that one of the other chips will in actuality be hotter than the designated chip, and may overheat when the designated chip is still at an acceptable temperature.

Another way to deal with multiple temperature-sensing signals is to provide digital logic to perform a logical OR function on all of the temperature-sensing signals from each of the chips on the MCP with respect to an overheating indication and use that result as the MCP temperature-sensing signal. In other words, the MCP could include digital logic that will indicate overheating for the MCP when even one individual chip indicates overheating, and only indicate an acceptable operating temperature when all of the chips in the MCP indicate an acceptable operating temperature. However, this can take up valuable space, increase interface and circuit complexity and power in the MCP.

Yet another way to deal with multiple temperature-sensing signals is to connect all of the temperature-sensing signals together in an open drain (or open collector) design. Each temperature-sensing signal could thus be set to a given voltage if it indicates overheating, and otherwise be left floating (i.e., its output line will be set to have a high impedance). This will have the effect of performing an OR operation on the temperature-sensing signals, but without the need for complex digital logic circuitry. In this case it may even be possible to selectively turn on and off the temperature sensors in individual chips to monitor subsets of chips or even individual chips. In this case, the temperature sensor output lines can be left floating, such that they won't interfere with the remaining signals.

FIG. 1 is a diagram of a multiple-chip memory device according to a disclosed embodiment. As shown in FIG. 1, the multiple-chip memory device 100 includes a combined memory 110, a memory controller 120, and a current source 130.

The combined memory 110 is an MCP that includes two or more memory chips 140, each of which receives the same temperature-control signals from the memory controller 120 and provides a sensor output signal indicating whether or not a measured temperature of the chip 140 is above a set temperature threshold. The sensor output signals from all of the memory chips are jointly connected to an intermediate node I. In this embodiment, the memory chips 140 could be any sort of memory element, e.g., DRAMS, SRAMS, EPROMS, EEPROMS, Flash memory, or any suitable semiconductor memory element.

If the temperature for a memory chip 140 is above the temperature threshold, the associated sensor output signal for the chip 140 will have a first value; and if the temperature for a chip 140 is not above the threshold, its associated sensor output signal will be left floating (i.e., its output line will be set to have a high impedance). In various embodiments the first value could be a logical "high" value (e.g., $V_{CC}$), a logical "low" value (e.g., ground), or any other desired voltage. In this embodiment the first value used to represent overheating is the same for all of the memory chips 140.

In addition, although not shown, each memory chip 140 also has the required input and output lines to perform all desired memory operations to store and retrieve data for a greater device or system, as would be understood by one skilled in the art.

The current source 130 provides a second value (e.g., a reference voltage $V_{REF}$) to the intermediate node I when all of the sensor output signals from all of the memory chips 140 are floating, but does not interfere with the voltage at the intermediate node I when even one of the sensor output signals provides the first voltage. In some embodiments the second value has an opposite logical value from the first value (i.e., when the first value is logical "high," the second value is logical "low"). Regardless, from the standpoint of the memory controller 120, the first value will represent an overheating of the combined memory 110, and the second value will indicate that the combined memory 110 is at an acceptable temperature.

In this way, the sensor output signals are combined using OR logic with respect whether they indicate an overheating, and are formed into a combined sensor output signal. In other words, if even one memory chip 140 indicates that it is overheating, the voltage at the intermediate node I (i.e., the combined sensor output signal) is driven to the first voltage. Only when all of the memory chips indicate no overheating is the voltage at the intermediate node I (i.e., the combined sensor output signal) driven to the second voltage by the current source 130.

In this embodiment, the current source 130 may be a separate element unto itself, it may be formed as a portion of the combined memory 110, or it may be formed as a portion of some other circuit altogether.

In the disclosed embodiment the current source 130 is a resistor R connected between the reference voltage $V_{REF}$ and the intermediate node I. However, alternate embodiments could use different types of current sources. For example, the resistor R could be replaced with a transistor. Other possible implementations for the current source 130 would be evident to one skilled in the art.

The memory controller 120 monitors the combined sensor output signal generated at the intermediate node I, and provides chip control signals to the memory chips 140 to regulate the operation of the memory chips 140. These chip control signals can regulate different aspects of the memory chip operation. For example, they might control the speed of a memory clock to regulate the amount of waste heat the memory chips 140 generate; they might control the frequency at which the memory elements on the memory chips 140 refresh to account for reduced performance at higher temperatures; or they might regulate when the memory chips 140 are turned on and off, allowing them to be shut down at extremely high temperatures. Other aspects of chip operation can also be regulated by these signals.

Since the memory controller 120 receives only one temperature-sensing input signal (i.e., the combined sensor output signal at the intermediate node I), it can treat the combined memory 110 as if it were a single memory chip that provided a single temperature-sensing signal. In practice, this can allow the MCP combined memory 110 to be backward compatible with memory controllers 120 designed for use with single-chip memory devices.

In this embodiment the memory controller 120 sends the same chip control signals to each memory chip, controlling each in the same manner. However, in alternate embodiments this need not be the case. In some particular embodiments a more complex memory controller 120 can be provided that may output chip control signals that include different temperature control signals or chip operational controls specific to individual memory chips 140 on the combined memory 110.

The memory controller 120 can also provide additional control signals to the memory chips 140, as required by the particular implementation. In other words, the memory controller 120 may be a circuit that controls other aspects of the operation of the memory chips 140 besides just heat monitoring and regulation. For example, in some embodiments the memory controller 120 may also coordinate the storage and retrieval of data to and from the memory chips 140.

Figure 2:
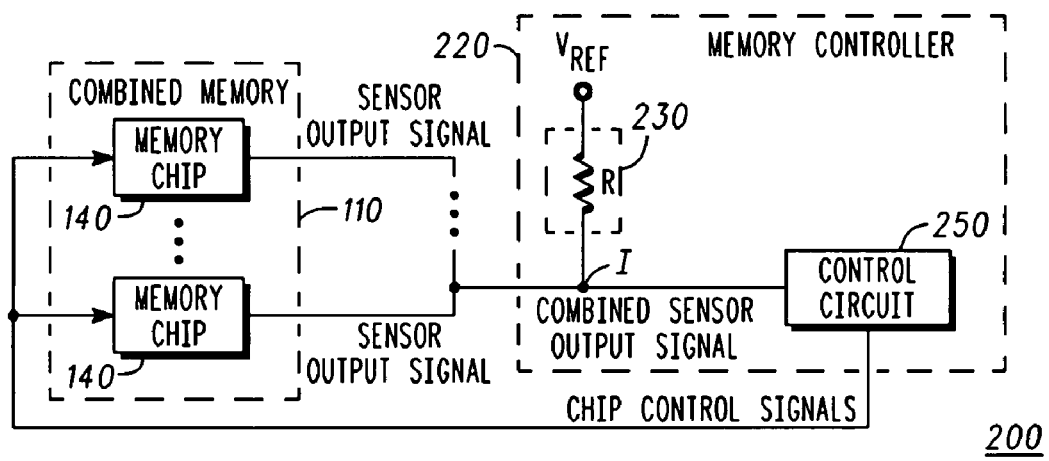
FIG. 2 is a diagram of a multiple-chip memory device according to a disclosed embodiment.

FIG. 2 is a diagram of a multiple-chip memory device according to a disclosed embodiment. As shown in FIG. 2, the multiple-chip memory device 200 includes a combined memory 110 and a memory controller 220. The combined memory 110 is an MCP that includes two or more memory chips 140; and the memory controller 220 includes a current source 230 and a control circuit 250. This multiple-chip memory device 200 is similar to the multiple-chip memory device 100 of FIG. 1, except for the positioning of the current source 230.

The current source 230 operates as the current source 130 of FIG. 1, except that it is internal to the memory controller 220, rather than separate. It is connected to the intermediate node I, which provides a combined sensor output signal to the control circuit.

The control circuit 250 performs the functions of the memory controller 120 of FIG. 1. It accepts the combined sensor output signal from the intermediate node I, and provides one or more chip control signals to the memory chips 140 on the combined memory 110.

Figure 3:
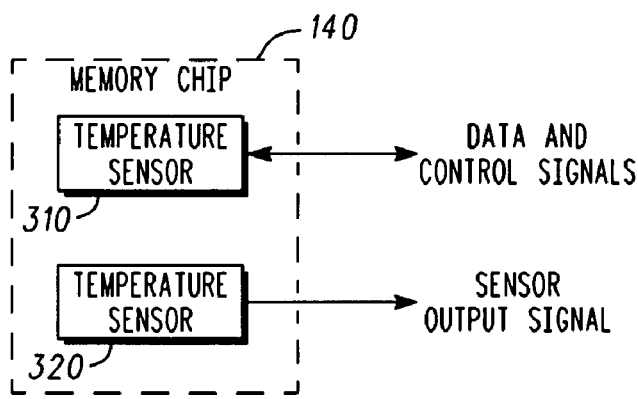
FIG. 3 is a diagram of the memory chip of FIGS. 1 and 2 according to a disclosed embodiment.

FIG. 3 is a diagram of the memory chip of FIGS. 1 and 2 according to a disclosed embodiment. As shown in FIG. 3, a memory chip 140 includes a memory circuit 310 and a temperature sensor 320.

The memory circuit 310 performs all of the memory storage and retrieval functions required by the memory. This can include writing, refreshing, and reading data, as well as any other desired functions. The memory circuit 310 receives data and control signals from an external source that uses its memory storage and provides stored data to the same source. This external source could include the control circuit 120, 220, or could be in addition to the control circuit 120, 220.

The temperature sensor 320 is proximate to the memory circuit 310 and operates to measure the temperature of the memory circuit 310, determine whether or not that temperature is above a set temperature threshold, and output a sensor output signal based on the result of that temperature sensing and threshold determination. The sensor output signal has a known value if the detected temperature is above the temperature threshold, and remains floating if the temperature is not above the temperature threshold.

The temperature sensor 320 and the memory circuit 310 need not be physically connected. In some embodiments the temperature sensor 320 can detect the temperature of the memory circuit 310 by proximity. However, in other embodiments the temperature sensor 320 may be physically connected to the memory circuit 310, or may even share some elements with the memory circuit 310 (e.g., control signals, power supply, etc.). The temperature sensor 320 may even directly exchange information and control signals with memory circuit 310 (e.g., the memory circuit 310 might disable or enable the temperature sensor 320 or override or calibrate temperature information). In yet other embodiments, the temperature sensor 320 might feed back temperature information to a memory chip for adjustment of refresh or calibration of the memory circuit 310. In some of these embodiments the temperature sensor 320 might receive control signals as well as output a sensor output signal.

Figure 4:
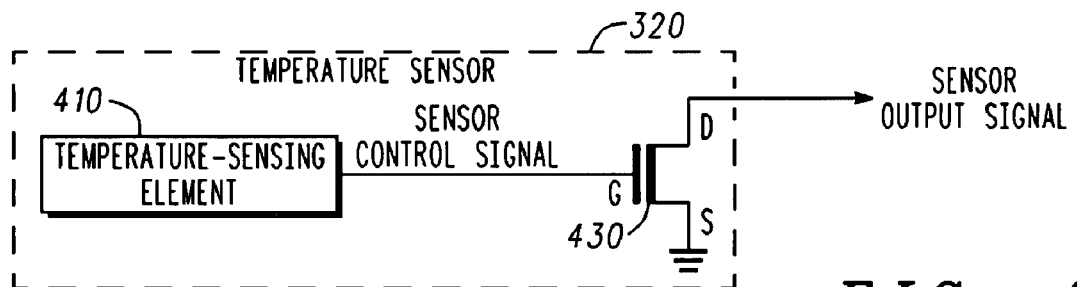
FIG. 4 is a diagram of the temperature sensor of FIG. 3 according to a disclosed embodiment.

FIG. 4 is a diagram of the temperature sensor of FIG. 3 according to a disclosed embodiment. As shown in FIG. 4, the temperature sensor 320 includes a temperature-sensing element 410 and a metal-oxide-semiconductor (MOS) transistor 430. In various embodiments the MOS transistor 430 may be a CMOS transistor, and more specifically an NMOS or a PMOS transistor.

The temperature-sensing element 410 operates to sense the temperature of the associated memory circuit 310, and compare it with the temperature threshold, and generates a sensor control signal based on this comparison.

The MOS transistor 430 has a source node S connected to ground; a drain node D serving to generate the sensor output signal; and a gate node G that receives the sensor control signal. The value of the sensor control signal is set by temperature-sensing element 410 such that it turns the MOS transistor 430 on when the sensor control signal indicates that a sensed temperature is above an overheating threshold, and turns the MOS transistor 430 off when the sensor control signal indicates that a sensed temperature is not above the overheating threshold. The particular parameters of the sensor control signal will vary in different embodiments based on the implementation of the MOS transistor 430.

Thus, when the sensor control signal indicates that the sensed temperature is above the overheating threshold, the MOS transistor 430 will be turned on and the sensor output signal will be set to ground. But if the sensor control signal indicates that the sensed temperature is not above the overheating threshold, the MOS transistor 430 will be turned off and the sensor output signal will be allowed to float (i.e., the drain D will be set to have a high impedance).

Figure 5:
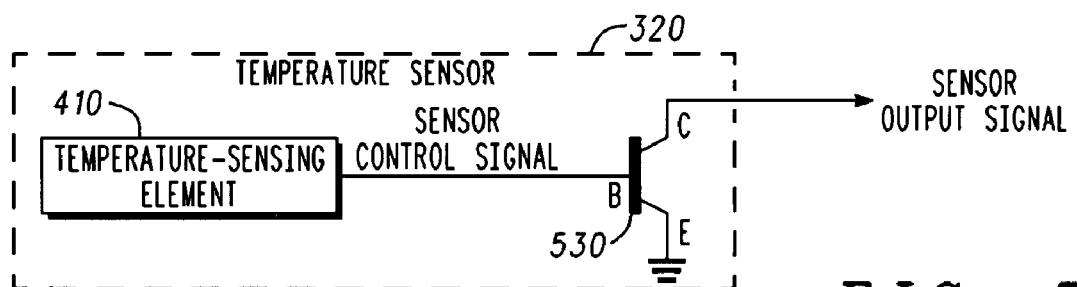
FIG. 5 is a diagram of the temperature sensor of FIG. 3 according to a disclosed embodiment.

FIG. 5 is a diagram of the temperature sensor of FIG. 3 according to a disclosed embodiment. As shown in FIG. 5, the temperature sensor 320 includes a temperature-sensing element 410 and a bipolar junction (BJT) transistor 530.

The temperature-sensing element 410 operates as noted above with respect to FIG. 4 to generate the sensor control signal.

The BJT transistor 530 has an emitter node E connected to ground; a collector node C serving to generate the sensor output signal; and a base node B that receives the sensor control signal. The value of the sensor control signal is set by temperature-sensing element 410 such that it turns the BJT transistor 530 on when the sensor control signal indicates that a sensed temperature is above an overheating threshold, and turns the BJT transistor 530 off when the sensor control signal indicates that a sensed temperature is not above the overheating threshold. The particular parameters of the sensor control signal will vary in different embodiments based on the implementation of the BJT transistor 530.

Thus, when the sensor control signal indicates that the sensed temperature is above the overheating threshold, the BJT transistor 530 will be turned on and the sensor output signal will be set to ground. But if the sensor control signal indicates that the sensed temperature is not above the overheating threshold, the BJT transistor 530 will be turned off and the sensor output signal will be allowed to float. (i.e., the collector C will be set to have a high impedance)

Figure 6:
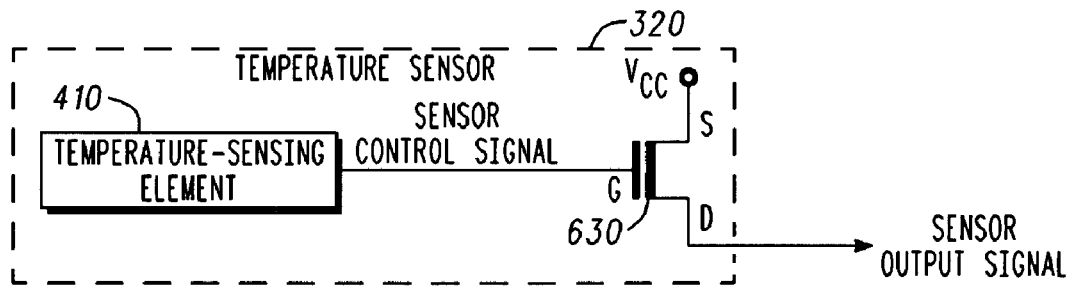
FIG. 6 is a diagram of the temperature sensor of FIG. 3 according to a disclosed embodiment.

FIG. 6 is a diagram of the temperature sensor of FIG. 3 according to a disclosed embodiment. As shown in FIG. 6, the temperature sensor 320 includes a temperature-sensing element 410 and a MOS transistor 630.

The temperature-sensing element 410 operates as noted above with respect to FIG. 4 to generate the sensor control signal.

The MOS transistor 630 has a source node S connected to a reference voltage $V_{CC}$; a drain node D serving to generate the sensor output signal; and a gate node G that receives the sensor control signal. The value of the sensor control signal is set by temperature-sensing element 410 such that it turns the MOS transistor 630 on when the sensor control signal indicates that a sensed temperature is above an overheating threshold, and turns the MOS transistor 630 off when the sensor control signal indicates that a sensed temperature is not above the overheating threshold. The particular parameters of the sensor control signal will vary in different embodiments based on the implementation of the MOS transistor 630.

Thus, when the sensor control signal indicates that the sensed temperature is above the overheating threshold, the MOS transistor 630 will be turned on and the sensor output signal will be set to the reference voltage $V_{CC}$. But if the sensor control signal indicates that the sensed temperature is not above the overheating threshold, the MOS transistor 630 will be turned off and the sensor output signal will be allowed to float. (i.e., the drain D will be set to have a high impedance)

Figure 7:
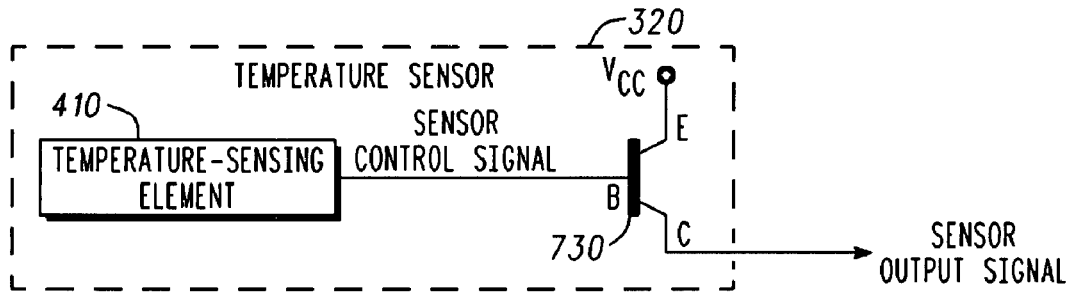
FIG. 7 is a diagram of the temperature sensor of FIG. 3 according to a disclosed embodiment.

FIG. 7 is a diagram of the temperature sensor of FIG. 3 according to a disclosed embodiment. As shown in FIG. 7, the temperature sensor 320 includes a temperature-sensing element 410 and a BJT transistor 730.

The temperature-sensing element 410 operates as noted above with respect to FIG. 4 to generate the sensor control signal.

The BJT transistor 730 has an emitter node E connected to a reference voltage $V_{CC}$; a collector node C serving to generate the sensor output signal; and a base node B that receives the sensor control signal. The value of the sensor control signal is set by temperature-sensing element 410 such that it turns the BJT transistor 730 on when the sensor control signal indicates that a sensed temperature is above an overheating threshold, and turns the BJT transistor 730 off when the sensor control signal indicates that a sensed temperature is not above the overheating threshold. The particular parameters of the sensor control signal will vary in different embodiments based on the implementation of the BJT transistor 730.

Thus, when the sensor control signal indicates that the sensed temperature is above the overheating threshold, the BJT transistor 730 will be turned on and the sensor output signal will be set to the reference voltage $V_{CC}$. But if the sensor control signal indicates that the sensed temperature is not above the overheating threshold, the BJT transistor 730 will be turned off and the sensor output signal will be allowed to float. (i.e., the collector C will be set to have a high impedance)

Figure 8:
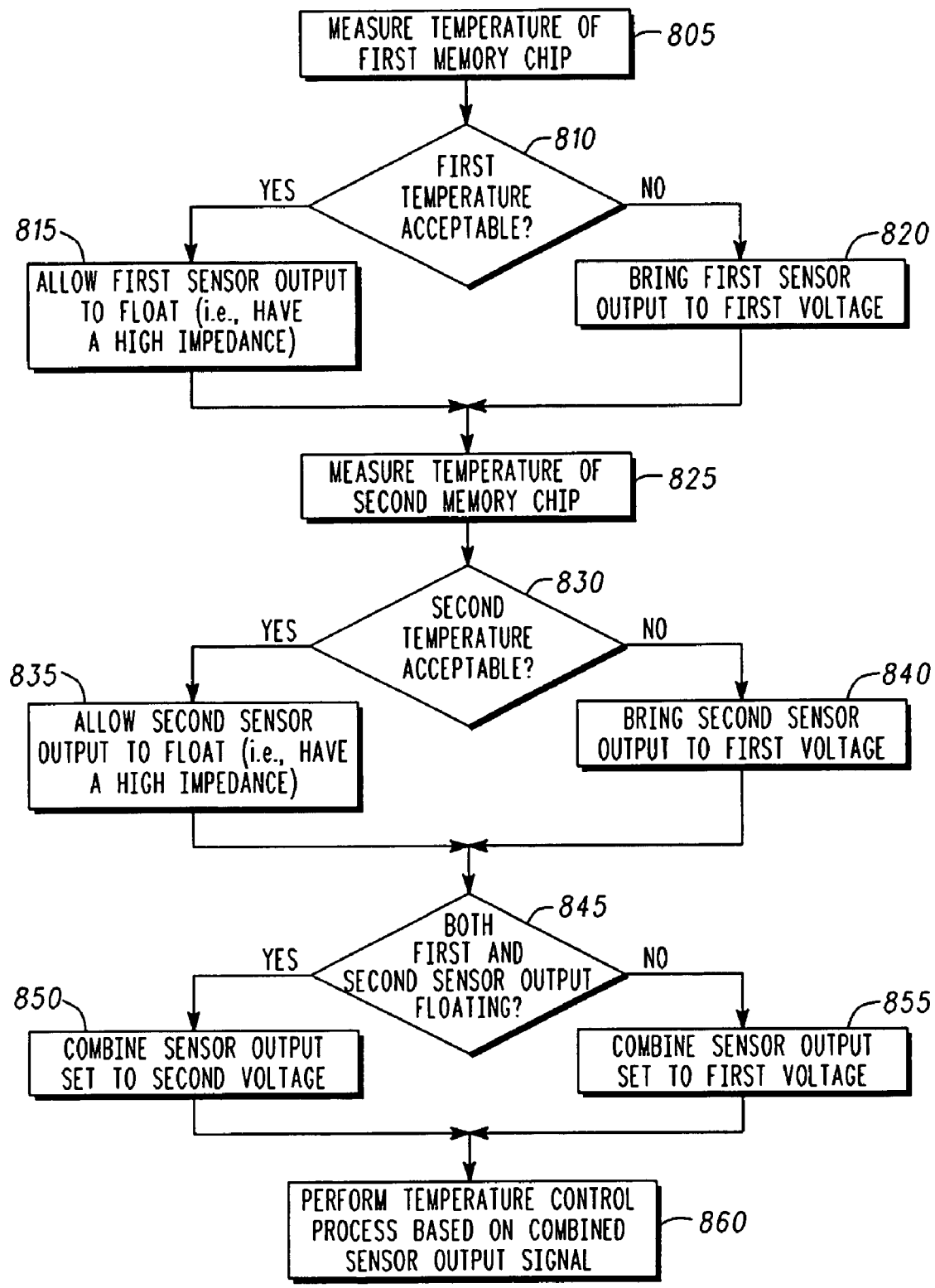
FIG. 8 is a flow chart of a temperature monitoring operation according to a disclosed embodiment.

FIG. 8 is a flow chart of a temperature monitoring operation according to a disclosed embodiment. As shown in FIG. 8, the method begins when temperature-sensing circuitry on a first memory chip in a multiple-chip package (MCP) measures a first temperature of the first memory chip (805).

The temperature-sensing circuitry on the first memory chip then determines whether or not the first temperature is acceptable or not (810). Typically this will involve comparing the first temperature to a temperature threshold to determine whether or not the first temperature is above the temperature threshold, although other parameters may be used (e.g., how long the first memory chip stays at the first temperature, etc.).

If the first temperature is acceptable, a first sensor output is allowed to float (815). In other words, a first sensor output line is set to a high impedance, where it won't effect the voltage at the node to which it's connected. In this case, the signal on the first sensor output line can go high or low, depending upon the voltage supplied to the node by other means.

If the first temperature is not acceptable, however, the first sensor output is set to a first voltage (820). This could be a voltage corresponding to a logical "high" or a voltage corresponding to a logical "low," depending upon the embodiment.

This process is also performed for a second memory chip in the MCP. Temperature-sensing circuitry on the second memory chip measures a second temperature of the second memory chip (825).

The temperature-sensing circuitry on the second memory chip then determines whether or not the second temperature is acceptable or not (830). Typically this will involve comparing the second temperature to the temperature threshold to determine whether or not the second temperature is above the temperature threshold, although other parameters may be used (e.g., how long the second memory chip stays at the second temperature, etc.).

If the second temperature is acceptable, a second sensor output is allowed to float (835). In other words, a second sensor output line is set to a high impedance, where it won't effect the voltage at the node to which it's connected. In this case, the signal on the second sensor output line can go high or low, depending upon the voltage supplied to the node by other means.

If the second temperature is not acceptable, however, the second sensor output is set to the first voltage (840).

Control circuitry then determines whether the first and second sensor outputs are floating or not (845) (i.e., whether the first and second sensor output lines have a high impedance or not). This can be achieved by connecting the first and second sensor output lines to a node that is also connected to a current source that tends to drive the node to a second voltage different than the first voltage. If the first and second sensor outputs are both floating, the current source will drive the node to the second voltage. But if either or both of the first and second sensor outputs are at the first voltage, the node will be driven to the first voltage.

If the control circuitry determines that both the first and second sensor outputs are floating (i.e., the first and second sensor output lines are at a high impedance), it sets a combined sensor output to a second voltage (850). If, however, the control circuitry determines that the first and second sensor outputs are not both floating (i.e., at least one is set to the first voltage), it sets the combined sensor output to a third voltage (850). In some embodiments, one of the second or third voltages could be the same as the first voltage.

Finally, the greater memory circuit performs overheating processing based on the combined sensor output signal (860). This could involve reducing the clock frequency of the memory chips, refreshing the memory chips more often, shutting the memory chips off for a time, or any desired processing.

Although FIG. 8 shows temperature sensing for only two separate chips on an MCP, this is by way of example only. The method could easily be extended to three or more chips on an MCP. In this case, control circuitry will determine whether or not all of the sensor outputs are floating to determine how to set the combined sensor output voltage.

Also, although FIG. 8 shows the temperature sensing of the first chip coming before the temperature sensing of the second chip, this is by way of example only. The temperature sensing of the two chips could be performed in any order, and could, in fact, be performed in parallel.

Although the above embodiments show a single sensor output signal for each chip, this is by way of example only. Alternate embodiments could use multiple sensor outputs to allow the reporting of multiple gradations of overheating. In one exemplary embodiment two output signals can be provided to indicate four separate temperature states. One of these states could indicate that the temperature was acceptable and one could indicate that the temperature was so high that the device should be shut off. The other two states could indicate lesser overheating, and instruct different temperature limiting operations be taken to reduce the temperature or accommodate the higher temperature (e.g., reducing the clock frequency, refreshing the memory device more often, etc.).

In such a multiple sensor output embodiment, the output lines can be connected in the manner described above such that the most conservative temperature-limiting operation is performed. In some cases this may cause the control circuitry might instruct that a greater temperature-limiting operation than necessary be performed. But it can be arranged such that a lesser temperature-limiting operation than necessary not be performed.

Although the disclosed embodiments refer to a multiple-chip package (MCP) memory device in which several memory chips are in one package, it is equally applicable to embodiments in which multiple memory circuits are printed individually on a circuit board and each have their own temperature-sensing signal.

Although the disclosed embodiments are described with respect to MCPs including multiple memory chips, the disclosed circuits and methods are equally applicable to MCPs including any sorts of semiconductor devices whose temperature must be monitored.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A temperature control circuit, comprising:
   a plurality of temperature sensors each configured to measure a temperature of a corresponding memory chip chosen from a plurality of memory chips, and to generate a sensor output signal that is set to a first voltage if the measured temperature of the corresponding memory chip meets a temperature requirement, and is set to a floating voltage if the measured temperature of the corresponding memory chip does not meet the temperature requirement, the sensor output signal being connected to an intermediate node;
   a current source connected to the intermediate node; and
   a control circuit configured to provide chip control signals to the plurality of memory chips.

2. The temperature control circuit of claim 1, wherein the current source is one of a resistor connected between the intermediate node and a second voltage, or a transistor connected between the intermediate node and a second voltage.

3. The temperature control circuit of claim 1,
   wherein the chip control signals operate to shut off one or more of the plurality of temperature sensors, and
   wherein the sensor output signals of the one or more shut-off temperature sensors are set to a floating voltage.

4. The temperature control circuit of claim 1,
   wherein the first voltage is one of a supply voltage or a ground voltage,
   wherein the second voltage is one of a supply voltage or a ground voltage, and
   wherein when the first voltage is the supply voltage, the second voltage is the ground voltage, and when the first voltage is the ground voltage, the second voltage is the supply voltage.

5. The temperature control circuit of claim 1, wherein the control circuit instructs the plurality of memory chips to perform temperature control operations based on the chip control signals when the voltage at the intermediate node is at the first voltage.

6. The temperature control circuit of claim 1, wherein each of the temperature sensors comprises:
   a temperature sensing element configured to provide a sensor control signal indicative of whether or not the measured temperature meets the temperature requirement; and
   a transistor configured to set the sensor output signal to one of the first voltage or the floating voltage in response to the sensor control signal.

7. The temperature control circuit of claim 1, wherein the resistor and the control circuit are formed on the same integrated circuit.

8. The temperature control circuit of claim 1, wherein the measured temperature in each of the memory chips does not meet the temperature requirement if it is above a set temperature threshold, and meets the temperature requirement if it is not above the set temperature threshold.

9. The temperature control circuit of claim 1, wherein the temperature control circuit is implemented in a printed circuit board device.

10. The temperature control circuit of claim 1, wherein the first transistor and the second transistors are both one of an open drain pull-down transistor, an open drain pull-up transistor, an open collector pull-down transistor, and an open collector pull-up transistor.

11. A memory device, comprising:
a first memory chip, including:
a first memory circuit configured to store data,
a first temperature sensing element configured to measure a first temperature of the first memory circuit and to generate a first sensor control signal that is indicative of whether or not the first temperature meets a first temperature requirement; and
a first transistor configured to set a first sensor output signal to a first voltage if the first temperature meets the first temperature requirement, and to a floating voltage if the first temperature does not meet the first temperature requirement, the first sensor output signal being connected to an intermediate node;
a second memory chip, including:
a second memory circuit configured to store data, and
a second temperature sensing element configured to measure a second temperature of the second memory circuit and to generate a second sensor control signal that is indicative of whether or not the second temperature meets a second temperature requirement; and
a second transistor configured to set a second sensor output signal to a first voltage if the second temperature meets the second temperature requirement, and to the floating voltage if the second temperature does not meet the second temperature requirement, the second sensor output signal being connected to the intermediate node;
a resistor connected between the intermediate node and a second voltage; and
a control circuit configured to provide chip control signals to the first and second memory chips based on a voltage at the intermediate node.

12. The memory device of claim 11, further comprising:
a third memory chip, including:
a third memory circuit configured to store data, and
a third temperature sensing element configured to measure a third temperature of the third memory circuit and to generate a third sensor control signal that is indicative of whether or not the third temperature meets a third temperature requirement; and
a third transistor configured to set a third sensor output signal to a first voltage if the third temperature meets the third temperature requirement, and to the floating voltage if the third temperature does not meet the third temperature requirement, the third sensor output signal being connected to the intermediate node;
wherein the control circuit is configured to provides the chip control signals to the third memory circuit.

13. The memory device of claim 11,
wherein the first voltage is one of a supply voltage and or a ground voltage,
wherein the second voltage is one of a supply voltage and or a ground voltage, and
wherein when the first voltage is the supply voltage, the second voltage is the ground voltage, and when the first voltage is the ground voltage, the second voltage is the supply voltage.

14. The memory device of claim 11, wherein the first temperature requirement is substantially equivalent to the second temperature requirement.

15. The memory device of claim 11, wherein the first transistor and the second transistors are both one of an open drain pull-down transistor, an open drain pull-up transistor, an open collector pull-down transistor, or an open collector pull-up transistor.

16. A method of measuring and controlling temperature in a multiple chip memory device, comprising:
measuring a first temperature of a first memory chip;
determining whether the first temperature meets a first temperature requirement;
setting a first sensor output line to high impedance if the first temperature meets the first temperature requirement;
connecting the first sensor output line to a first voltage if the first temperature does not meet the first temperature requirement;
measuring a second temperature of a second memory chip;
determining whether the second temperature meets a second temperature requirement;
setting a second sensor output line to high impedance if the second temperature meets the second temperature requirement;
connecting the second sensor output line to the first voltage if the second temperature does not meet the second temperature requirement;
setting a combined sensor output signal to the first voltage if either the first sensor output line or the second sensor output line are connected to the first voltage; and
setting the combined sensor output signal to a second voltage if both the first and second sensor output lines are at a high impedance,
wherein the first memory chip and the second memory chip are formed as part of a single packaged device.

17. The method of claim 16, wherein the first temperature requirement is substantially equivalent to the second temperature requirement.

18. The method of claim 16, further comprising performing temperature control measures on the first and second memory chips when the combined sensor output signal is at the first voltage.

19. The method of claim 16, further comprising
measuring a third temperature of a third memory chip;
determining whether the third temperature meets a third temperature requirement;
setting a third sensor output line to high impedance if the third temperature meets the third temperature requirement; and
connecting the third sensor output line to the first voltage if the third temperature does not meet the second temperature requirement;
wherein the combined sensor output signal is set to the first voltage if any of the first sensor output line, the second sensor output line, or the third sensor output line are connected to the first voltage, and
wherein the combined sensor output signal is set to the second voltage if all of the first, second, and third sensor output lines are at a high impedance, and
wherein the first memory chip, the second memory chip, and the third memory chip are formed as part of the one packaged device.

20. The method of claim 16,
wherein the first temperature does not meet the first temperature requirement if it is above a first temperature threshold, and meets the first temperature requirement if it is not above the first temperature threshold; and
wherein the second temperature does not meet the second temperature requirement if it is above a second temperature threshold, and meets the second temperature requirement if it is not above the second temperature threshold.

21. The method of claim 16, wherein the method is implemented in a printed circuit board device.

22. A temperature control circuit, comprising:
 means for measuring a first temperature of a first memory chip;
 means for determining whether the first temperature meets a first temperature requirement;
 means for setting a first sensor output line to high impedance if the first temperature meets the first temperature requirement;
 means for connecting the first sensor output line to a first voltage if the first temperature does not meet the first temperature requirement;
 means for measuring a second temperature of a second memory chip;
 means for determining whether the second temperature meets a second temperature requirement;
 means for setting a second sensor output line to high impedance if the second temperature meets the second temperature requirement;
 means for connecting the second sensor output line to the first voltage if the second temperature does not meet the second temperature requirement;
 means for setting a combined sensor output signal to the first voltage if either the first sensor output is connected to the first voltage; and
 means for setting the combined sensor output signal to a second voltage if both the first and second sensor output lines are at a high impedance,
 means for wherein the first memory chip and the second memory chip are formed as part of one packaged device.

23. The temperature control circuit of claim 22, wherein the first temperature requirement is substantially equivalent to the second temperature requirement.

24. The temperature control circuit of claim 22, further comprising means for performing temperature control measures on the first and second memory chips when the combined sensor output signal is at the first voltage.

25. The temperature control circuit of claim 22, further comprising
 means for measuring a third temperature of a third memory chip;
 means for determining whether the third temperature meets a third temperature requirement;
 means for setting a third sensor output line to high impedance if the third temperature meets the third temperature requirement; and
 means for connecting the third sensor output line to the first voltage if the third temperature does not meet the second temperature requirement;
 wherein the combined sensor output signal is set to the first voltage if any of the first sensor output line, the second sensor output line, or the third sensor output line are connected to the first voltage,
 wherein the combined sensor output signal is set to the second voltage if all of the first, second, and third sensor output lines are at a high impedance, and
 wherein the first memory chip, the second memory chip, and the third memory chip are formed as part of the one packaged device.

26. The temperature control circuit of claim 22, wherein the temperature control circuit is implemented in a printed circuit board device.

\* \* \* \* \*